United States Patent
Chudzik et al.

(10) Patent No.: US 7,459,913 B2
(45) Date of Patent: Dec. 2, 2008

(54) METHODS FOR THE DETERMINATION OF FILM CONTINUITY AND GROWTH MODES IN THIN DIELECTRIC FILMS

(75) Inventors: Michael P. Chudzik, Beacon, NY (US); Joseph F. Shepard, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 340 days.

(21) Appl. No.: 10/710,947

(22) Filed: Aug. 13, 2004

(65) Prior Publication Data

US 2006/0035393 A1    Feb. 16, 2006

(51) Int. Cl.
*G01N 27/60* (2006.01)
*G01R 31/26* (2006.01)
*G01R 27/08* (2006.01)

(52) U.S. Cl. ................ 324/455; 324/719; 324/713; 438/14

(58) Field of Classification Search ............ 324/455, 324/765, 719, 713; 438/14
See application file for complete search history.

(56) References Cited

U.S. PATENT DOCUMENTS

| | | | |
|---|---|---|---|
| 5,485,091 A | 1/1996 | Verkuil | |
| 5,498,974 A | 3/1996 | Verkuil et al. | |
| 5,644,223 A | 7/1997 | Verkuil | |
| 6,097,196 A | 8/2000 | Verkuil et al. | |
| 6,593,748 B1 | 7/2003 | Halliyal et al. | |
| 6,759,255 B2 * | 7/2004 | Xu et al. .................. | 438/14 |
| 2003/0132381 A1 | 7/2003 | Itagaki et al. | |
| 2005/0003662 A1 * | 1/2005 | Jursich et al. ............ | 438/681 |

* cited by examiner

*Primary Examiner*—Diego Gutierrez
*Assistant Examiner*—Amy He
(74) *Attorney, Agent, or Firm*—Yuanmin Cai; Hoffman Warnick

(57) ABSTRACT

A method for determining film continuity and growth modes in thin dielectric films includes: depositing a material on the substrate using a first value of a growth metric; depositing an amount of charge on a surface of the material; repetitively measuring a surface voltage of the material until an onset of tunneling to provide a Vtunnel (or Etunnel) value; repeating the above steps for different values of the growth metric; and comparing the Vtunnel (or Etunnel) values for different values of the growth metric to provide a measure of the continuity of the material on the substrate. The growth modes of the material can be determined by comparing the first derivative of the Vtunnel or Etunnel per growth metric curve versus the growth metric, and examining the linearity of the results of the comparison. The growth metric parameters may include thickness, time, precursor cycles, or temperature.

15 Claims, 6 Drawing Sheets

METHODS FOR THE DETERMINATION OF FILM CONTINUITY AND GROWTH MODES IN THIN DIELECTRIC FILMS

BACKGROUND OF INVENTION

The present invention relates generally to semiconductor processing and, in particular, to methods for the determination of film continuity and growth modes in thin dielectric films.

Thickness scaling of deposited high-k gate dielectrics is limited by physiochemical properties of the deposition process and is a function of numerous factors such as surface energies, steric hindrance, surface diffusion, grain growth and coalescence. The ability to measure the transition point between a film suffering from discontinuities, which limits the effective leakage reduction and capacitance gain in gate dielectrics to a continuous film, is important in developing advanced high performance gate dielectric films for 45 nm devices and beyond.

A well-known problem with high-k gate dielectrics is the inability to scale the film thickness below ~25 Å. For example, hafnium oxide ($HfO_2$) nucleates in islands on interfacial silicon oxynitride (SiON) layers that do not coalesce into a continuous film until ~25 Å. This phenomenon causes increased leakage currents in film with a thickness below ~25 Å and prevents gate dielectric scaling below this value. This in turn prevents scaling of thickness-in-inversion (Tinv) to values required by the gate roadmap for future integrated circuit chips.

Different interfaces and growth conditions strongly influence the growth mode and coalescent point of thin films that nucleate in islands. To this extent, the evaluation of the effects of surface preparation (e.g., precleaning solution, substrate temperature, interfacial barrier material, precursor chemistry, etc.) on the nucleation and growth of dielectric materials is important for the determination of optimum conditions for layer-by-layer growth. In the past, this type of analysis was performed using expensive, destructive, and time-consuming analytical chemical techniques that required a skilled operator and extensive sample preparation. Examples of such techniques include Rutherford Backscattering Spectroscopy (RBS), Medium Energy Ion Scattering (MEIS), and High-Resolution Transmission Electron Microscopy (HRTEM). Unfortunately, these types of chemical and physical techniques have been found to provide erroneous results regarding film continuity for ultra-thin films. Accordingly, there is a need for a method for evaluating the effects of surface preparation on the nucleation and growth of dielectric materials that obviates these and other problems associated with the prior art.

SUMMARY OF INVENTION

The present invention provides a non-contact and non-destructive method for the determination of film continuity and growth modes in ultra-thin films such as gate dielectrics deposited by Atomic Layer Deposition. The method can be used to quickly and with minimal expense determine and evaluate the effects of surface preparation (e.g., precleaning solution, substrate temperature, interfacial barrier material, etc.) on the nucleation and growth of dielectric materials, and to identify the ideal growth conditions for layer-by-layer deposition of ultrathin dielectric films. The methodology of the present invention utilizes electrical metrics to determine film coverage and is therefore more suitable (e.g., accurate) for the analysis of electronic materials than chemical techniques.

The invention is based upon the characterization of electrical leakage characteristics of a deposited material on an unpatterned substrate. In particular, the invention is based upon the electrical characterization of an ultra-thin material (e.g., a high-k dielectric) using a corona discharge method whereby a fixed but large amount of electric charge Q is deposited on the surface of the material. The corresponding surface voltage Vs is measured at some time $\Delta t$, which is typically in milliseconds, but can range from microseconds to seconds after deposition. This measurement is repeated until the surface voltage Vtunnel at the onset of tunneling is determined. For a continuous film, Vs will increase in a linear fashion as a function of thickness, while for a discontinuous film the increase in Vs will be a function of the size and number density of the islands and their physical thickness in the x, y, and z directions. Vtunnel can be further divided by an arbitrary yet constant film thickness to yield an electric field metric defined as Etunnel (in units of MV/cm). The above steps are repeated for different values of a growth metric (e.g., thickness, time, cycles of precursors, temperature, etc.), and the Vtunnel or Etunnel values at the onset of tunneling are compared to provide a measure of the continuity of the material for different values of the growth metric. As will become apparent from the following description, the present invention provides a fast and reliable technique for determining the effects of the growth processes and substrate materials on the growth properties of materials such as high-k gate dielectrics, for quantifying the transition point to a continuous film, and for determining the growth mode of the material.

A first aspect of the invention is directed to a method for determining continuity of a material on a substrate, comprising: depositing the material on the substrate using a first value of a growth metric; depositing an amount of charge on a surface of the material; repeatedly measuring a surface voltage of the material until an onset of tunneling to provide a Vtunnel value; repeating the above steps for different values of the growth metric; and comparing the Vtunnel values for different values of the growth metric to provide a measure of the continuity of the material on the substrate.

A second aspect of the invention is directed to a method for determining a growth mode of a material on a substrate, comprising: depositing the material on the substrate using a first value of a growth metric; depositing an amount of charge on a surface of the material; repeatedly measuring a surface voltage of the material until an onset of tunneling to provide a Vtunnel value; repeating the above steps for different values of the growth metric; and comparing a first derivative of a Vtunnel per growth metric curve versus the growth metric to determine the growth mode of the material on the substrate.

A third aspect of the invention is directed to a system for determining continuity and growth mode of a material deposited on a substrate, comprising: means for depositing a fixed amount of charge on a surface of the material; means for repeatedly measuring a surface voltage of the material until an onset of tunneling to provide a Vtunnel value; and means for determining the continuity and growth mode of the material using Vtunnel values obtained for different values of a growth metric.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
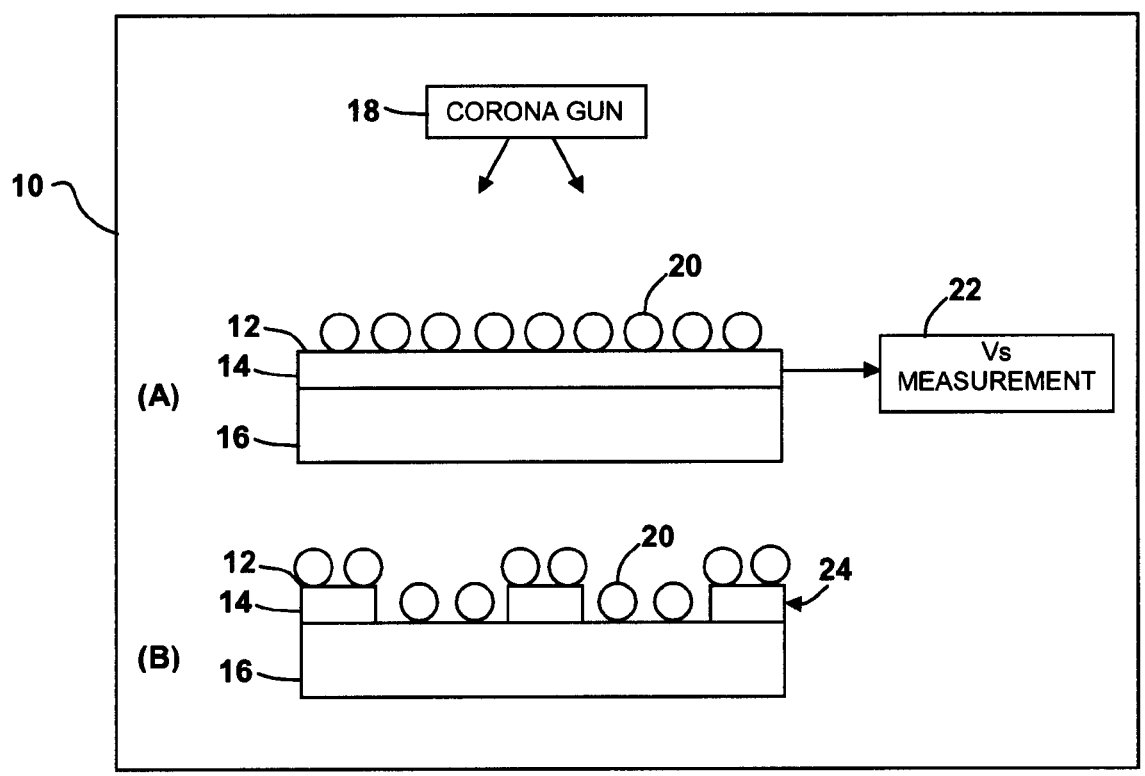
FIG. 1 depicts a corona discharge system for depositing charge on the surface of a material to be tested and for measuring the surface voltage of the material.

FIG. 1 schematically illustrates a corona discharge system 10 for depositing charge on a surface 12 of a material 14 (e.g., a thin dielectric film) to be tested and for repetitively measuring the surface voltage Vs of the material 14 over time until the onset of tunneling is determined. The corona discharge system 10 can be used in-line in a semiconductor processing line. The material 14 is deposited on a substrate 16 (e.g., a blanketed wafer). Such a corona discharge system 10 is disclosed, for example, in U.S. Pat. No. 6,097,196 to Verkuil et al., incorporated herein in its entirety by reference. Verkuil et al. discloses a method and apparatus for measuring tunneling field for an oxide layer on a semiconductor wafer. The corona discharge system 10 includes a corona gun 18 for depositing charge 20 (e.g., via thermalized ions) on the surface 12 of material 14 to be tested, and a voltage measurement system 22 for measuring the surface voltage Vs of the material 14 over time. As shown in section (A) of FIG. 1, the material 14 comprises a continuous film, while in section (B) of FIG. 1, the material 14 comprises a discontinuous film including islands 24.

Figure 2:
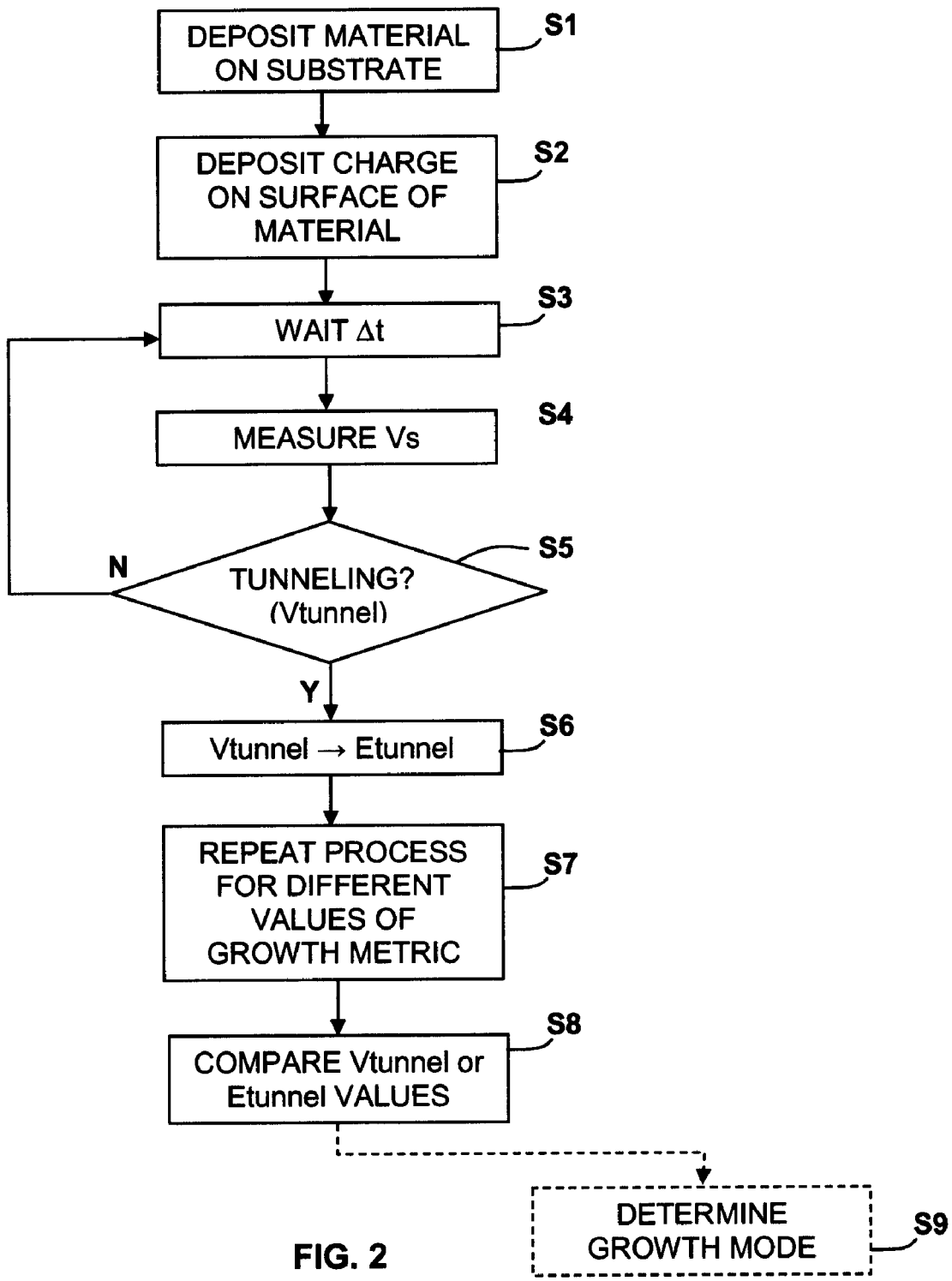
FIG. 2 depicts a flow diagram illustrating a method in accordance with an embodiment of the present invention.

A flow diagram depicting a method in accordance with one embodiment of the present invention is illustrated in FIG. 2, with reference to FIG. 1. In this embodiment, the continuity of the material 14 for different values of a growth metric (e.g., thickness, time, cycles of precursors, temperature, etc.) can be determined. In step S1, the material 14 (e.g., a thin dielectric film) is deposited on the unpatterned substrate 16. The material 14 can be deposited using ALD or other suitable deposition techniques. In step S2, a fixed amount of electric charge 20 (e.g., via thermalized ions) is deposited on the surface 12 of the material 14 using corona gun 18. After some time At after deposition (step S3), the surface voltage Vs on the material 14 is measured (step S4) using voltage measurement system 22. This measurement is repeated until the surface voltage Vtunnel at the onset of tunneling is determined (step S5). In step S6, Vtunnel can optionally be expressed in terms of the electric field metric Etunnel (in units of MV/cm), wherein Etunnel is equal to the surface voltage at the onset of tunneling Vtunnel divided by an arbitrary yet constant film thickness. Steps S1-S6 are repeated (step S7) for different values of a growth metric (e.g., thickness, time, cycles of precursors, temperature, etc.), and the Vtunnel or Etunnel values at the onset of tunneling are compared (step S8) to provide a measure of the continuity of the material 14 for different values of the growth metric.

The present invention has been applied to thin films of aluminum oxide ($Al_2O_3$) and $HfO_2$ deposited using alternating cycles of TriMethylAluminum (TMA) and water ($H_2O$) or ozone ($O_3$) and hafnium chloride ($HfCl_4$) and $H_2O$, respectively, on 200 mm and 300 mm silicon wafers. Of course, as will be apparent to one skilled in the art, the present invention can be used in conjunction with many other types of materials, substrates, interface layers, precursors, etc., without departing from the intended scope of the present invention. A corona discharge system was used to measure the film coverage versus deposition cycle of these materials on silicon substrates with interface layers. In particular the nucleation and growth of $HfO_2$ thin films have been studied as a function of precursor pulsed sequence on various interface layers: HF-last, $NH_3$-base silicon nitride ($Si_3N_4$), $SiO_xN_y$, and chemical oxide interfaces.

Figure 3:
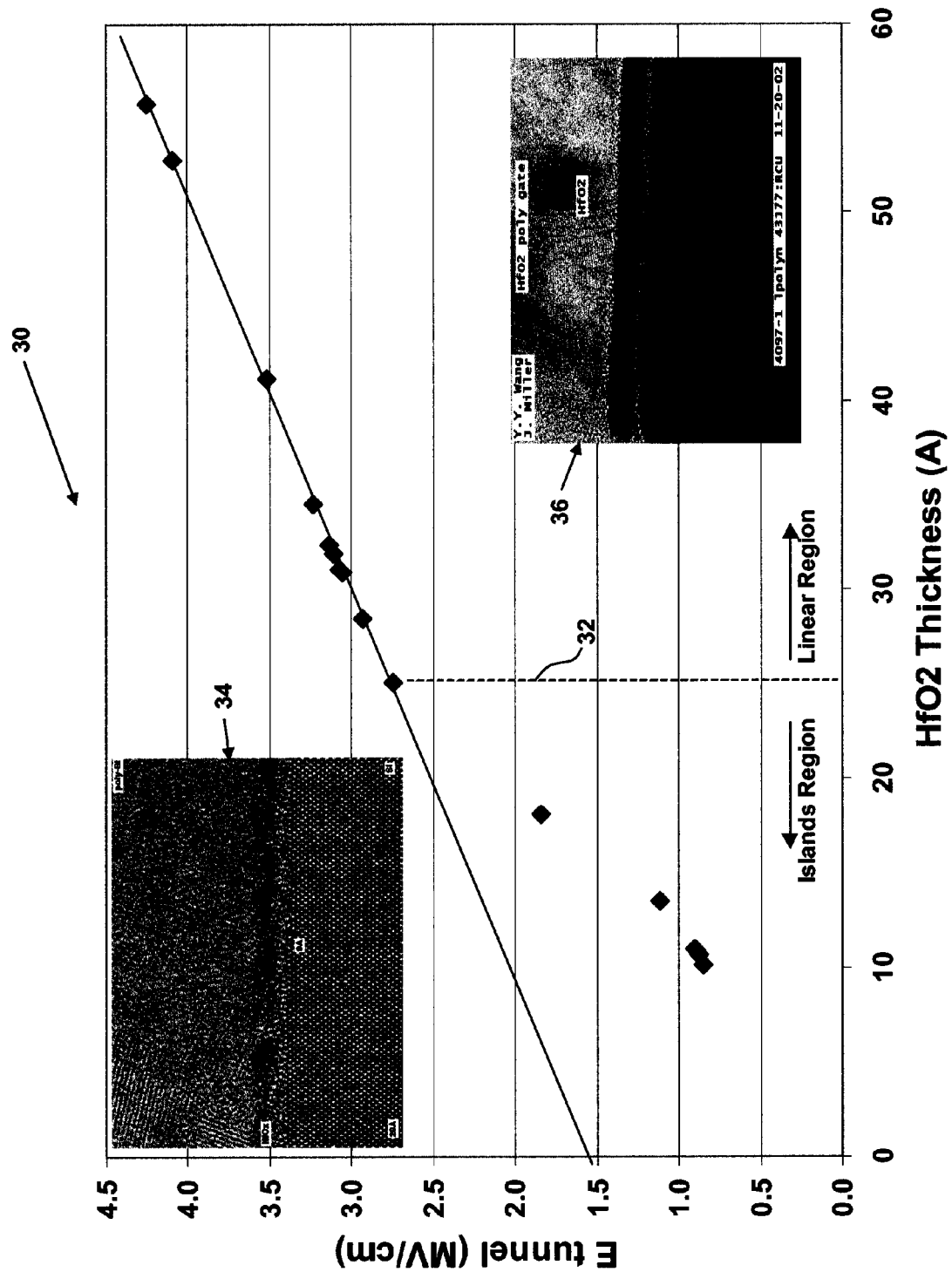
FIG. 3 illustrates a graph of Etunnel versus $HfO_2$ thickness produced in accordance with the present invention.

An example of a graph 30 produced using the process steps depicted in FIG. 2 is illustrated in FIG. 3. In particular, FIG. 3 shows the Etunnel versus thickness of Metal Organic Chemical Vapor Deposition (MOCVD) deposited $HfO_2$ on 9 Å SiON interfaces. It can easily be seen in FIG. 3 that the transition 32 from linearity (layer-by-layer/linear film growth) to non-linearity (island-like film growth) occurs at an $HfO_2$ thickness of about 25 Å. Thus, for $HfO_2$ thicknesses of less than 25 Å, one would expect island-like film growth, while for $HfO_2$ thicknesses of greater than 25 Å, one would expect layer-by-layer film growth. This corresponds to the thickness that High Resolution Transmission Electron Microscopy (HR-TEM) images confirm that $HfO_2$ changes from island-like growth to continuous growth (see inset HR-TEM images 34, 36). Acquisition time of these Etunnel values is less than one minute per spot allowing for the complete nondestructive mapping of 200 mm and 300 mm wafers in significantly less time and with lower costs than RBS, HRTEM, and MEIS and with greater detail in cross-wafer uniformity, which is not practical with these other techniques.

Figure 4:
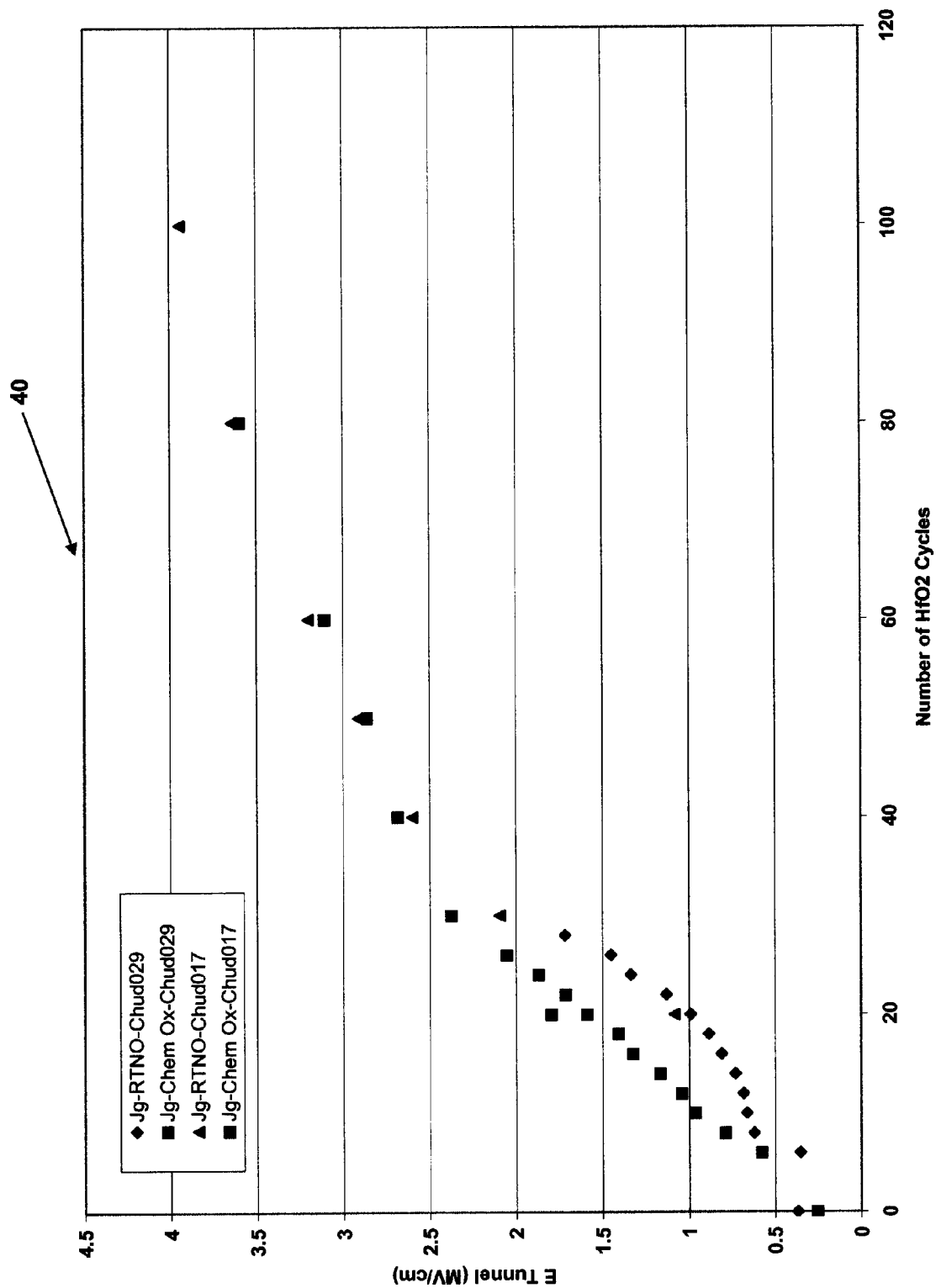
FIG. 4 illustrates a graph of Etunnel versus number of $HfO_2$ atomic layer cycles produced in accordance with the present invention.

Another example of a graph 40 produced using the process steps depicted in FIG. 2 is illustrated in FIG. 4. Graph 40 can be used to differentiate the effects of integration and processing on the electrical quality of a gate structure. To generate graph 40, $HfO_2$ films were deposited by ALD on two different surfaces: chemical oxide and SiON (from high temperature rapid thermal (RTNO) processing). The graph 40 of Etunnel versus $HfO_2$ atomic layer cycles clearly shows that using an —OH terminated chemical oxide promotes continuous growth to a greater extent than SiON. These results are qualitatively similar to results shown by a method of the prior art using RBS, thus showing the accuracy of the present invention.

In accordance with another embodiment of the present invention, the growth mode of a material under investigation can be easily determined by comparing the first derivative of the Vtunnel or Etunnel per growth metric curve versus the growth metric. This is based on the ALD growth model that teaches a methodology by which thin films start out as nucleated islands that grow large and eventually coalesce as a function of film thickness. This model can be used to determine the growth mode of the films when the amount of material deposited per cycle is plotted versus cycle. The linear portion(s) of such a plot is an indication of layer-by-layer (continuous) growth whereas any non-linearity is an indication of islanded growth. The growth mode determining step can be added to the method of FIG. 2 as step S9 (shown in phantom).

The surface voltage Vtunnel at the onset of tunneling, and the Etunnel value calculated using Vtunnel, are first order functions of the film thickness and thus functions of the amount of material deposited. Since the tunneling I-V behavior is governed by $I=(V/d)^2 \ast \exp(-bd/V)$, where b is a constant and d is film thickness, one can see that the voltage at tunneling is strongly dependent on film thickness and thus the amount of material in the thin film. The Vtunnel/cycle and Etunnel/cycle are analogous to the amount of material deposited per cycle and therefore can be used to determine the nucleation and growth. The Vtunnel/cycle and Etunnel/cycle given in the steady state region (continuous film region) are the expected amount of material deposited for a given growth metric, and any deviation from this at the early stages of growth is an indication of less (or more material) than expected and can be used to model the growth mode of the films.

The Vtunnel value measured using a corona discharge system (and corresponding Etunnel value) can substitute for a chemically determined quantity and is in fact more sensitive to film morphology than chemical methods. It is also dependent on electrical film qualities such as grain boundaries and roughness. Unlike electrical techniques such as those used in the present invention, areal sampling by chemical methods such as Secondary Ion Mass Spectroscopy (SIMS), total reflection x-ray fluorescence (TXRF) and MEIS are not functions of grain boundaries and roughness. The tunneling voltage Vtunnel (or Etunnel) can therefore be useful in determining the growth modes of electrical films such as gate dielectrics.

Figure 5A:
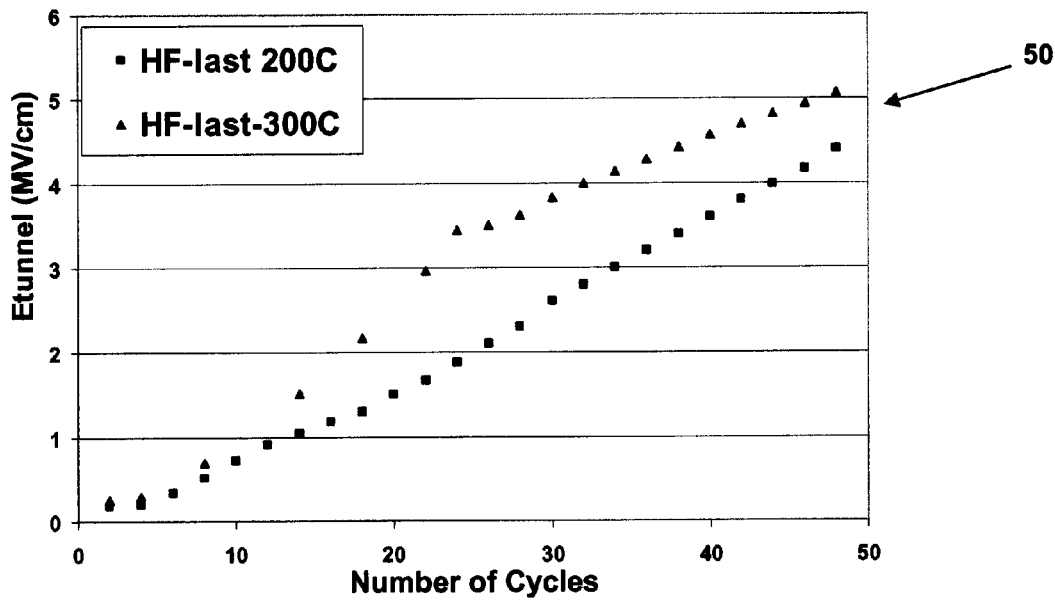
FIG. 5A illustrates a graph of Etunnel versus number of ALD precursor cycles produced in accordance with the present invention.
Figure 5B:
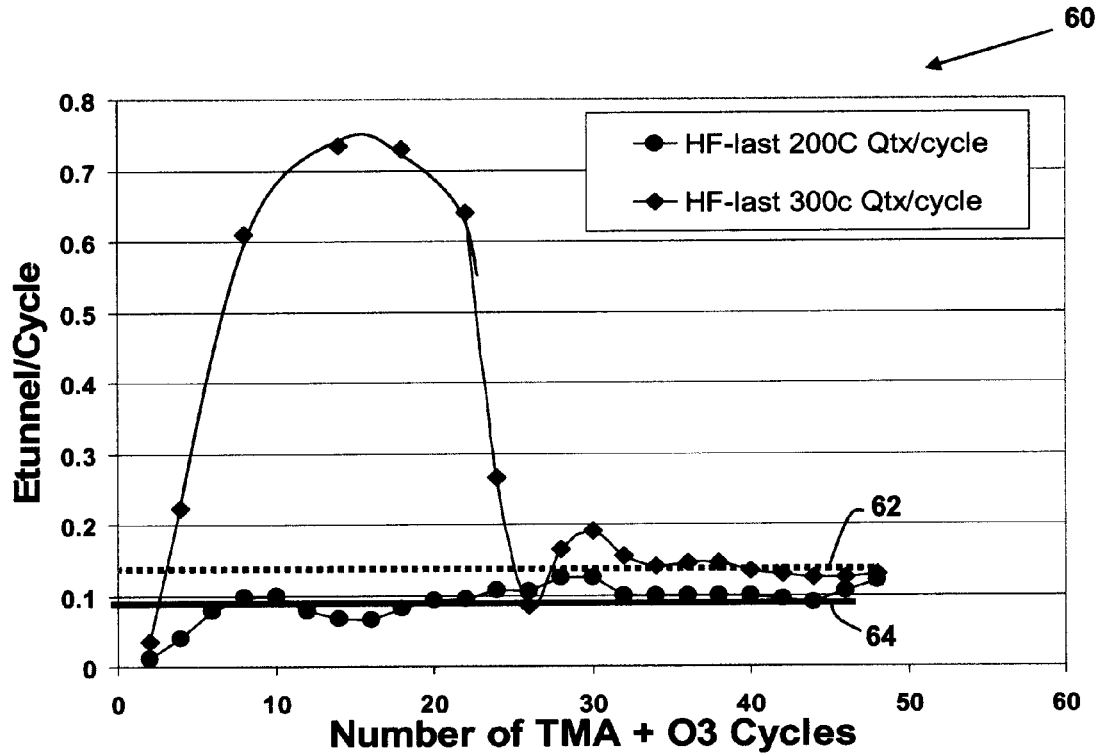
FIG. 5B illustrates a graph of the first derivative of Etunnel per cycle (from FIG. 5A) plotted versus the number of cycles.

An example of this embodiment of the present invention is shown in FIGS. 5A and 5B. FIG. 5A illustrates a graph 50, generated in accordance with the above-described embodiment of the present invention, of Etunnel versus ALD precursor cycle for $Al_2O_3$ deposited on a hydrogen terminated surface using TMA and $O_3$ at a substrate temperature of 200° C. and 300° C. FIG. 5B illustrates a graph 60 of the first derivative of Etunnel per cycle (from FIG. 5A) plotted versus the number of cycles. It can be seen in FIG. 5B that up until about cycle number twenty-eight, the Etunnel/cycle for HF-last at 200° C. changes drastically, indicating that tall islands are probably being formed. However, after about twenty-nine cycles, the Etunnel/cycle for HF-last at 200° C. settles down to a substantially constant base-line value (shown as dashed line 62) indicating that the islands have coalesced into a continuous film exhibiting layer-to-layer growth. The Etunnel/cycle for HF-last at 300° C., however, changes much less drastically and for fewer cycles (~nine) before settling down to a substantially constant base-line value (shown as solid line 64). This indicates that smaller islands are being produced that quickly coalesce (i.e., in fewer cycles) into a continuous film. From FIG. 5B, therefore, it can be seen that the growth mode was dramatically altered by the substrate temperature.

Figure 6:
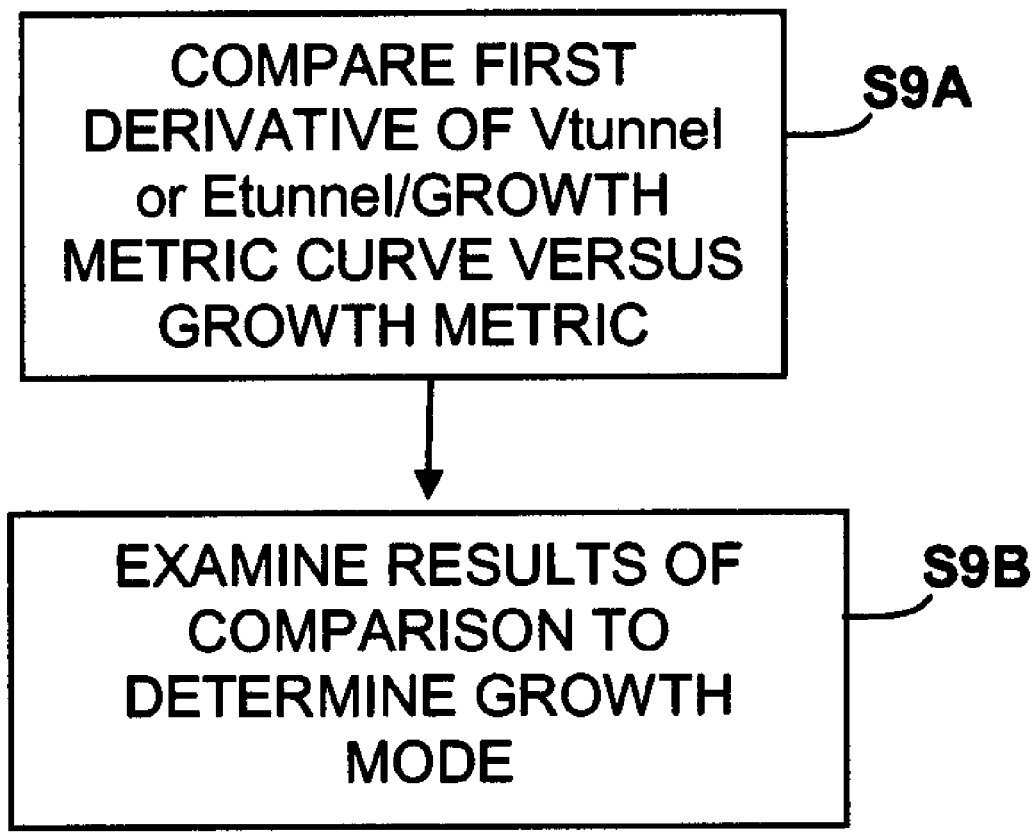
FIG. 6 depicts a flow diagram illustrating a method in accordance with another embodiment of the present invention.

Thus, in accordance with the present invention, as illustrated in FIG. 6, the growth mode of a material on a substrate can be determined as follows: (step S9A) comparing (e.g., using a graph) the first derivative of the Vtunnel or Etunnel per growth metric curve versus the growth metric; and (step S9B) examining the results of the comparison (e.g., by examining the shape of the resultant graph) to determine the growth mode of the material. The examining step may include the steps of identifying regions of islanded growth and identifying areas of layer-to-layer (i.e., continuous) growth based on the linearity of the results of the comparison.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for determining continuity of a material on a substrate, comprising:
    depositing the material on the substrate using a first value of a growth metric;
    depositing an amount of charge on a surface of the material;
    repeatedly measuring a surface voltage of the material until an onset of tunneling to provide a Vtunnel value;
    repeating the above steps for different values of the growth metric;
    determining a growth mode of the material on the substrate, the determining including:
        comparing a first derivative of a Vtunnel per growth metric curve versus the growth metric; and
        examining a linearity of results of the comparison to determine the growth mode of the material on the substrate, wherein a linear region corresponds to a layer-by-layer growth mode of the material on the substrate, and wherein the non-linear region corresponds to an islanded growth mode of the material on the substrate; and
    comparing the Vtunnel values for different values of the growth metric to provide a measure of the continuity of the material on the substrate.

2. The method of claim 1, wherein the step of comparing the Vtunnel values further comprises:
    determining a transition between a linear region and a non-linear region of the Vtunnel values, wherein the linear region corresponds to layer-by-layer growth of the material on the substrate, and wherein the non-linear region corresponds to islanded growth of the material on the substrate.

3. The method of claim 1, wherein the growth metric is selected from the group consisting of thickness, time, precursor cycles, and temperature.

4. The method of claim 1, wherein the material is deposited on the substrate using Atomic Layer Deposition (ALD).

5. The method of claim 1, wherein a fixed amount of charge is deposited on the surface of the material.

6. The method of claim 1, wherein the method is non-destructive and can be used in-line.

7. The method of claim 1, wherein the material is a high-k dielectric material.

8. The method of claim 1, wherein the step of comparing the Vtunnel values further comprises:
    identifying optimum growth conditions for layer-by-layer deposition of the material on the substrate.

9. The method of claim 1, further comprising the steps of:
    dividing each Vtunnel value by a constant thickness value to provide an Etunnel value; and
    comparing the Etunnel values for different values of the growth metric to provide a measure of the continuity of the material on the substrate.

10. The method of claim 9, wherein the step of comparing the Etunnel values further comprises:
    determining a transition between a linear region and a non-linear region of the Etunnel values, wherein the linear region corresponds to layer-by-layer growth of the material on the substrate, and wherein the non-linear region corresponds to islanded growth of the material on the substrate.

11. The method of claim 9, wherein the step of comparing the Etunnel values further comprises:
   identifying optimum growth conditions for layer-by-layer deposition of the material on the substrate.

12. A method for determining a growth mode of a material on a substrate, comprising:
   depositing the material on the substrate using a first value of a growth metric;
   depositing an amount of charge on a surface of the material;
   repeatedly measuring a surface voltage of the material until an onset of tunneling to provide a Vtunnel value;
   repeating the above steps for different values of the growth metric; and
   comparing a first derivative of a Vtunnel per growth metric curve versus the growth metric to determine the growth mode of the material on the substrate.

13. The method of claim 12, further comprising the steps of:
   dividing each Vtunnel value by a constant thickness value to provide an Etunnel value; and
   comparing a first derivative of an Etunnel per growth metric curve versus the growth metric to determine the growth mode of the material on the substrate.

14. The method of claim 12, wherein the growth metric is selected from the group consisting of thickness, time, precursor cycles, and temperature.

15. The method of claim 12, further comprising:
   examining a linearity of results of the comparison to determine the growth mode of the material on the substrate, wherein a linear region corresponds to a layer-by-layer growth mode of the material on the substrate, and wherein the non-linear region corresponds to an islanded growth mode of the material on the substrate.

* * * * *